United States Patent [19]

Okamura et al.

[11] Patent Number: 5,300,903
[45] Date of Patent: Apr. 5, 1994

[54] BAND-PASS FILTER

[75] Inventors: Hisatake Okamura; Tetsuo Taniguchi, both of Nagaokakyo, Japan

[73] Assignee: Murata Manufacturing Co., Ltd., Japan

[21] Appl. No.: 903,614

[22] Filed: Jun. 24, 1992

[30] Foreign Application Priority Data

Jun. 27, 1991 [JP] Japan .................. 3-156521

[51] Int. Cl.$^5$ .................................. H01P 1/20
[52] U.S. Cl. ....................... 333/204; 333/219
[58] Field of Search ............. 333/193, 202, 204, 203, 333/205, 206, 219, 235, 246, 219.1, 185, 184, 174; 361/321, 308; 336/200

[56] References Cited

U.S. PATENT DOCUMENTS

| | | | |
|---|---|---|---|
| 4,468,642 | 8/1984 | Hikita | 333/193 |
| 4,754,242 | 6/1988 | Okamura et al. | 333/175 |
| 4,894,629 | 1/1990 | Okamura et al. | 333/177 |
| 4,916,582 | 4/1990 | Okamura et al. | 361/321 |
| 4,918,570 | 4/1990 | Okamura et al. | 361/321 |
| 4,963,843 | 10/1990 | Peckham | 333/203 |
| 5,075,650 | 12/1991 | Okamura et al. | 333/177 |
| 5,105,176 | 4/1992 | Okamura et al. | 333/219 |
| 5,124,675 | 6/1992 | Komazaki et al. | 333/204 |
| 5,140,497 | 8/1992 | Kato et al. | 361/321 |
| 5,144,268 | 9/1992 | Weidman | 333/204 |
| 5,173,671 | 12/1992 | Wendler et al. | 333/185 |

*Primary Examiner*—Raymond A. Nelli
*Attorney, Agent, or Firm*—Ostrolenk, Faber, Gerb & Soffen

[57] ABSTRACT

An earth electrode pattern is formed on one surface of a plate consisting of a dielectric material. Earth terminal patterns are extended from the earth electrode pattern to the side faces of the plate. Two coil electrode patterns are formed on both sides of the earth electrode pattern with plates between the earth electrode pattern and two coil electrode patterns. Take-out terminal patterns and earth terminal patterns are drawn out from the coil electrode patterns toward end portions of the plate. The take-out terminal pattern and the earth terminal pattern of one coil electrode pattern are disposed at a distance having a predetermined impedance. A connecting window for magnetically connecting two coil electrode patterns is formed in the earth electrode pattern. The earth terminal patterns of the earth electrode pattern and the earth terminal patterns of the coil electrode patterns are connected.

28 Claims, 12 Drawing Sheets

F I G. 13
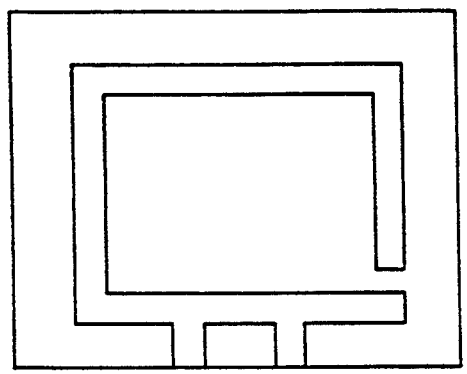
F I G. 14
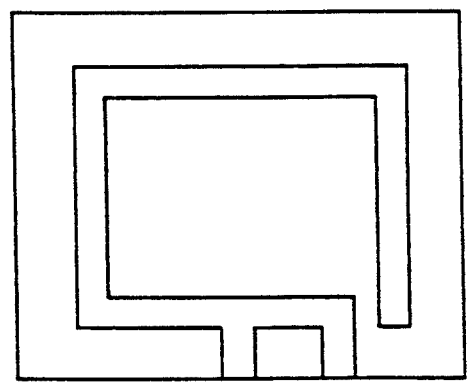

F I G. 15
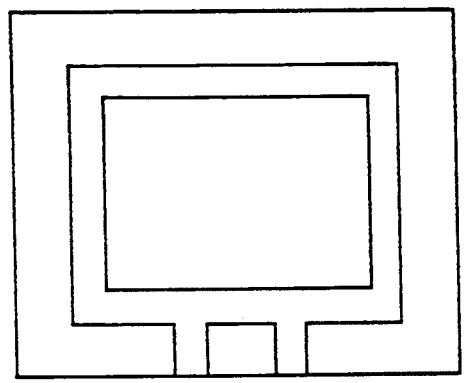

BAND-PASS FILTER

BACKGROUND OF THE INVENTION

1. Field of the Invention

The present invention relates to a dielectric-laminate type band-pass filter for use in a portable radio or the like having an operating frequency in the range of several hundred MHz to several GHz.

2. Description of the Prior Art

Conventional resonators are divided roughly into resonators using a strip line and resonators using a coil pattern. When producing a band-pass filter by using such resonators, plural resonators are coupled magnetically.

Examples of resonators using the strip line are a resonator of $\frac{1}{2}$ wavelength whose line is open at both ends as shown in FIG. 18, and a resonator of $\frac{1}{4}$ wavelength whose line is open at one end and shortcircuited at the other end as shown in FIG. 19.

An example of a resonator using the coil pattern, as shown in FIG. 20, is one in which a spiral-shaped coil pattern 201 and an earth pattern 203 are formed on both sides of a dielectric layer 202 which is clamped therebetween.

In the band-pass filter using the above-mentioned conventional resonators, however, such problems as shown hereinafter were encountered respectively.

[1] band-pass filter using the strip line (a) A resonator having a resonance frequency of 2 to 3 GHz becomes substantially large. In particular, in the band-pass filter having a construction in which plural resonators are connected, it becomes considerably large. This is due to the following reasons.

The lengths $L_{10}$, $L_{11}$ of the strip line are determined as shown in Equation 1 (resonator of $\frac{1}{2}$ wavelength) and Equation 2 (resonator of $\frac{1}{4}$ wavelength).

$$L_{10} = \frac{1}{2} \lambda \times \frac{1}{\sqrt{\epsilon}} \quad \text{Equation 1}$$

$$L_{11} = \frac{1}{4} \lambda \times \frac{1}{\sqrt{\epsilon}} \quad \text{Equation 2}$$

Where, $\lambda$; wavelength, $\epsilon$; dielectric constant of dielectric-laminate sheet.

At present, a dielectric constant of dielectric-laminate sheet which can be co-fired with silver or copper and has a good temperature characteristic can not be made so large, only about $\epsilon \approx 10$. Thus, in the above Equations 1 and 2, when the resonance frequency is 3 GHz, and supposing $\epsilon = 10$, $L_{10} = 15.8$ mm and $L_{11} = 7.9$ mm, which are very long, thus resulting in a large resonator (band-pass filter) as stated above.

(b) in the band-pass filter, it is desirable to adjust the input/output impedances depending on the apparatus into which it is incorporated (to adjust and thereby match the impedances of the band-pass filter and the apparatus). However, in case of the strip-line type, since the input/output impedances have peculiar values for every strip line, it is impossible to adjust and match, even by changing the input/output connection position of the strip line.

[2] band-pass filter using the coil-pattern

Since the coil pattern has a spiral shape, magnetic fluxes influence one another between the adjoining patterns, thus interfering with electric current flow. Therefore, a substantial resistance increases and the Q of the filter becomes lower.

For example, in FIG. 20, since the electric current flows in the same direction (in a direction D in FIG. 20) in a pattern piece 201a and a pattern piece 201b, magnetic fields cancel each other to cause the magnetic flux to become coarse, and consequently electric current flow is disturbed and the substantial resistance increases.

The increase in resistance causes that an insertion loss of the band-pass filter becomes larger as a result of the reduction in Q.

SUMMARY OF THE INVENTION

The present invention has been devised in view of such present circumstances, and therefore, it is an object thereof to provide a band-pass filter which has a high Q and a low insertion loss, and moreover, the insertion loss can be minimized, and wherein the input/output impedances can be adjusted optionally.

The present invention is directed to a band-pass filter comprising, a first electrode; two second electrodes formed in a loop shape and disposed opposite the first electrode with plates of a dielectric material between the first electrode and each of the second electrodes; two earth terminals drawn out respectively from the two second electrodes toward peripheral portions of the plates; two input/output terminals drawn out respectively from the two second electrodes toward peripheral portions of the plates at a selected distance from the earth terminals so as to provide a predetermined input/output impedance; and other earth terminals drawn out from the first electrode toward peripheral portions of the plates, wherein a connecting window for coupling the two second electrodes magnetically is formed in the first electrode.

When the filter is constructed as stated above, because it has a so-called strip-line construction in which the first electrode and the second electrodes, and because no pattern pieces of the second electrodes are adjacent to each other as in the spiral-shaped coil pattern, the Q is improved remarkably and the insertion loss is reduced, improving its skirt characteristics.

Moreover, since the second electrodes have a loop shape, the element size becomes smaller. In addition, since the input/output impedance can be adjusted by just changing a distance between the input/output terminal and the corresponding earth terminal of a second electrode, it is very simply to adjust the impedance.

In these respects, the invention has an effect of providing a very excellent small-sized band-pass filter whose insertion loss is small and whose input/output impedances can be adjusted optionally.

The above and further objects, features and advantages of the present invention will be more fully apparent from the following detailed description of the illustrated embodiments with accompanying drawings.

BRIEF DESCRIPTION OF THE DRAWINGS

FIG. 13 is a plan view of essential portions of a band-pass filter according to a modified example of the present invention.

FIG. 14 is a plan view of essential portions of a band-pass filter according to another modified example of the present invention.

FIG. 15 is a plan view of essential portions of a band-pass filter according to a further modified example of the present invention.

DESCRIPTION OF THE PREFERRED EMBODIMENTS

First Example

Figure 1:
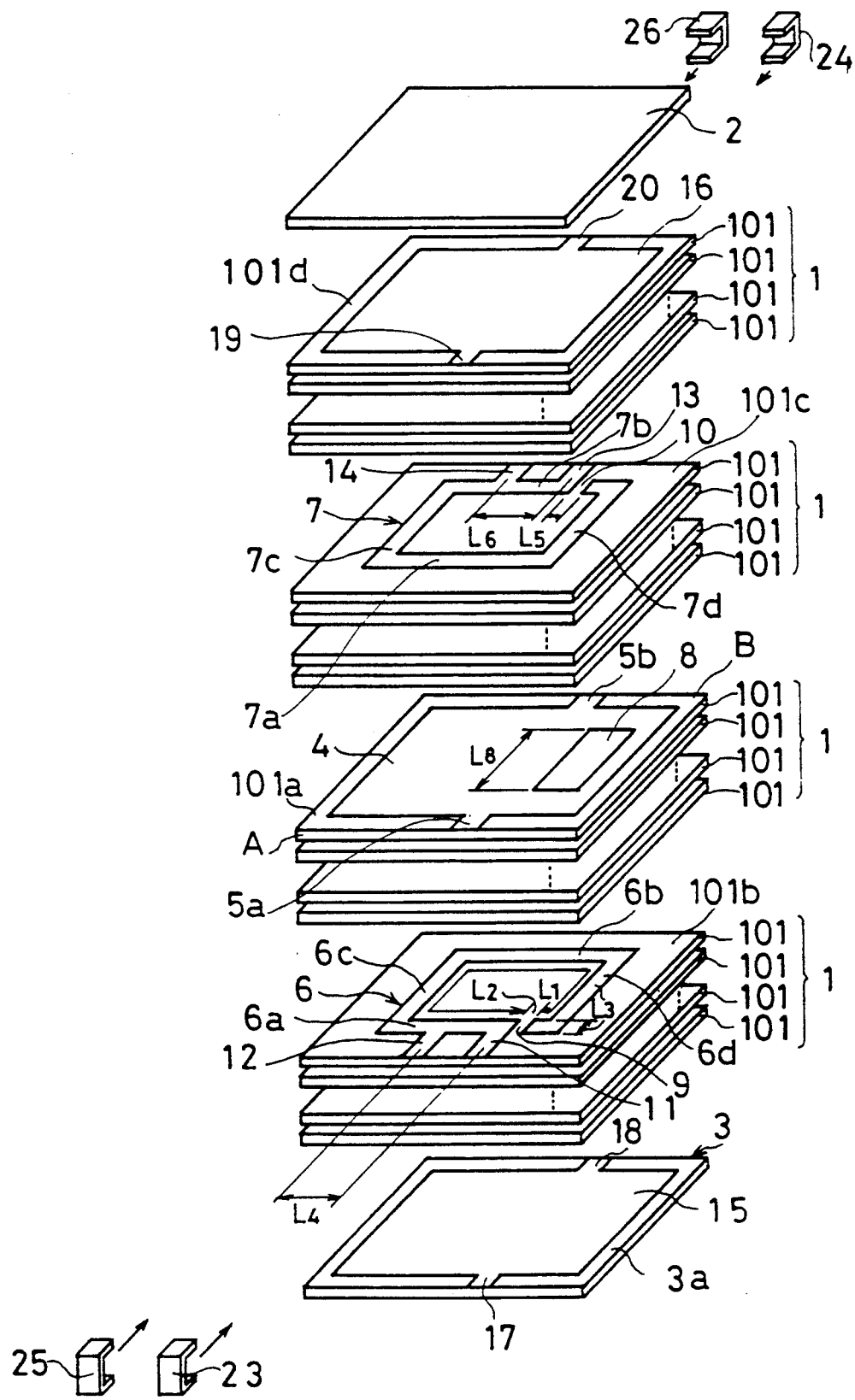
FIG. 1 is an exploded perspective view of a band-pass filter according to a first example of the present invention.
Figure 2:
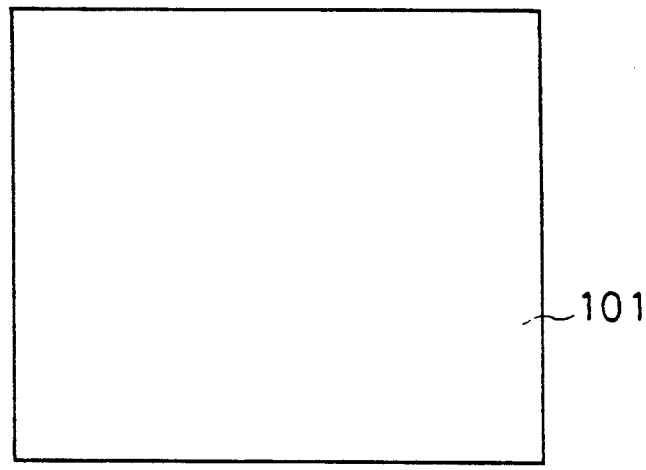
FIG. 2 is a plan view of a dielectric sheet used in FIG. 1.
Figure 3:
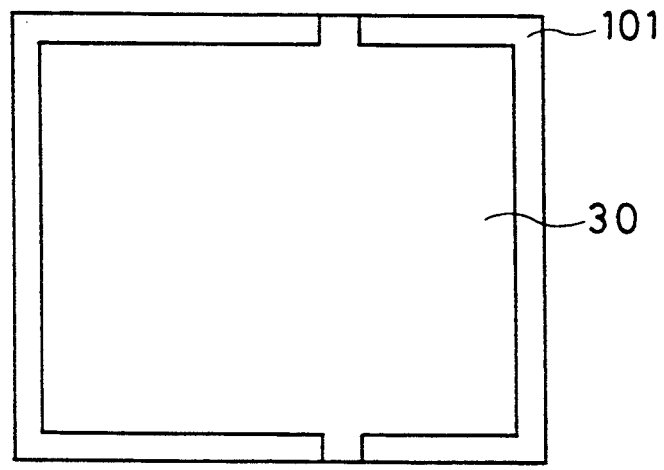
FIG. 3 is a plan view showing a state where a second earth electrode pattern is formed on the dielectric sheet of FIG. 2.
Figure 4:
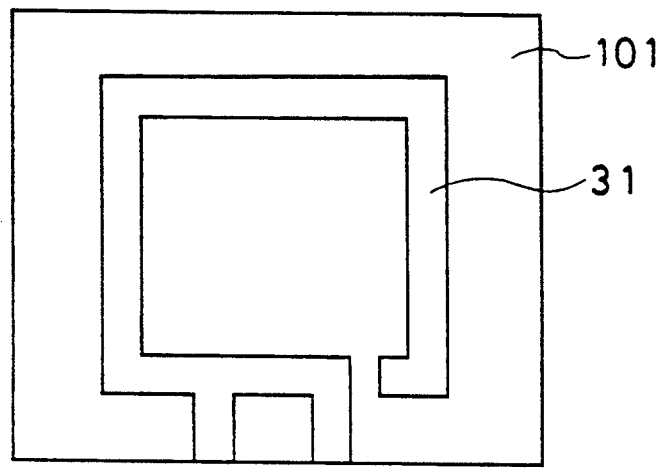
FIG. 4 is a plan view showing a state where a first coil electrode pattern is formed on the dielectric sheet of FIG. 2.
Figure 5:
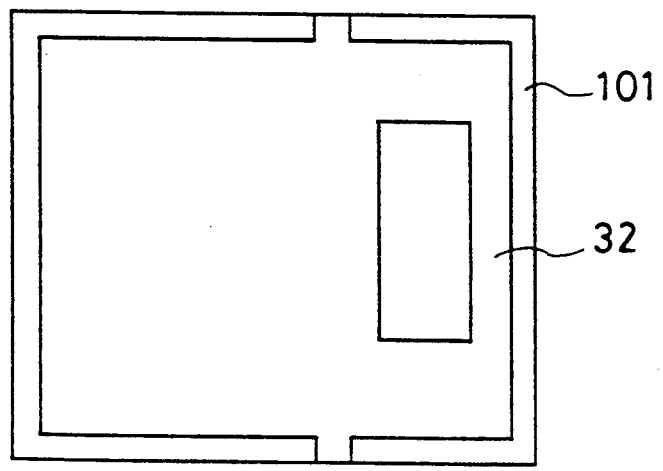
FIG. 5 is a plan view showing a state where a first earth electrode pattern is formed on the dielectric sheet of FIG. 2.
Figure 6:
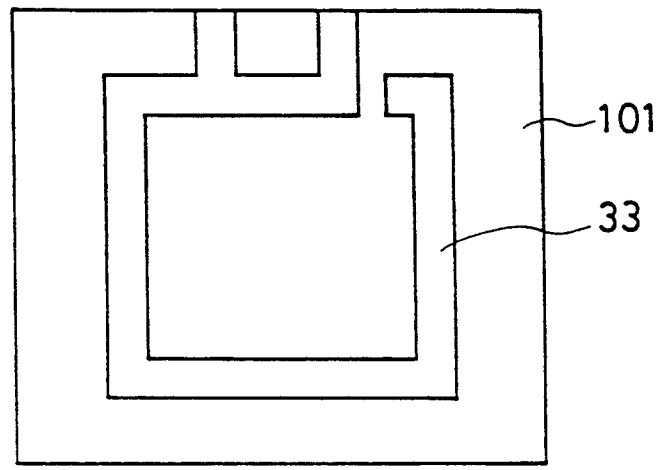
FIG. 6 is a plan view showing a state where a second coil electrode pattern is formed on the dielectric sheet of FIG. 2.
Figure 7:
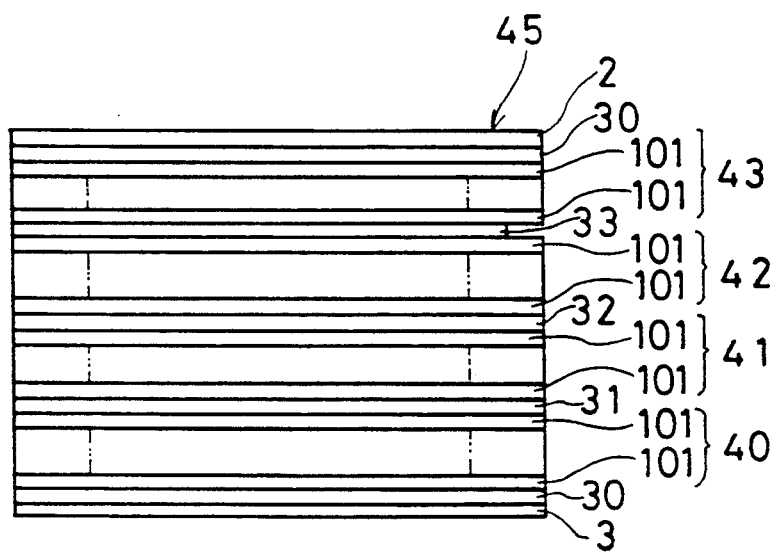
FIG. 7 is a side view when the dielectric sheets are laminated.
Figure 8:
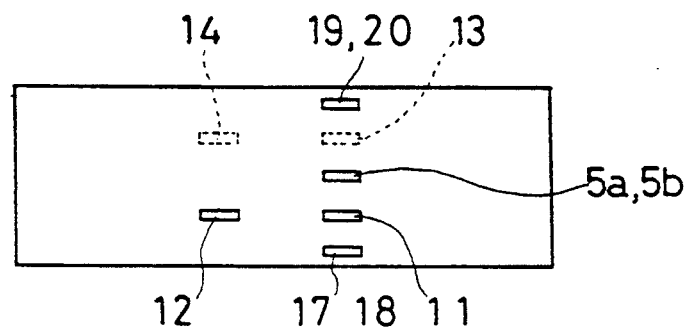
FIG. 8 is a front view when a laminate is pressed.
Figure 9:
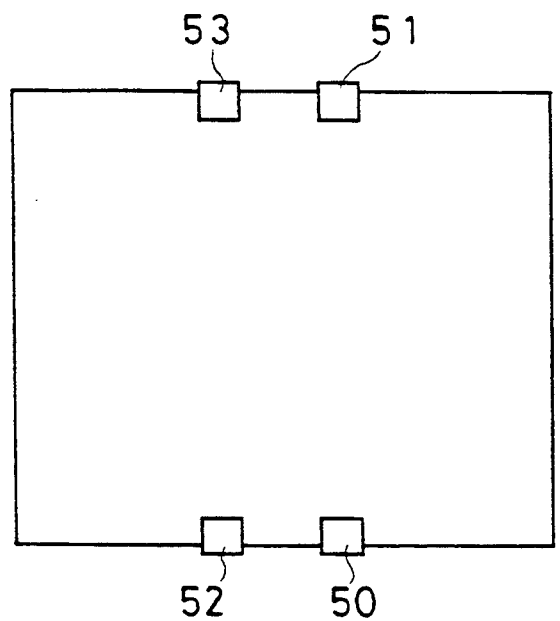
FIG. 9 is a plan view when external electrodes are formed.
Figure 10:
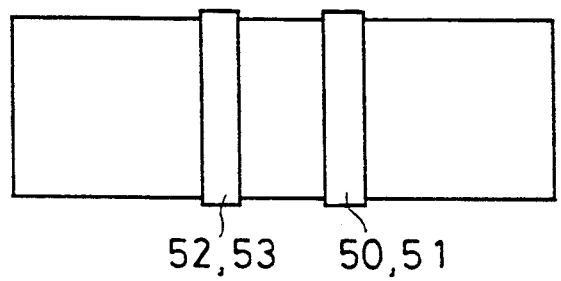
FIG. 10 is a front view when external electrodes are formed.
Figure 11:
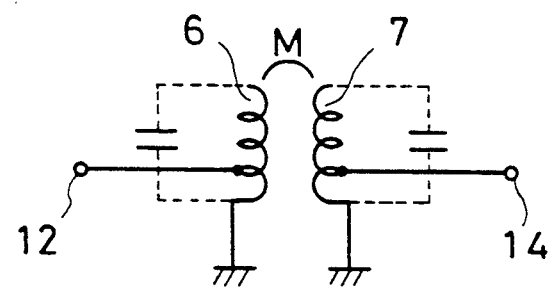
FIG. 11 is an equivalent circuit diagram of the band-pass filter.
Figure 12:
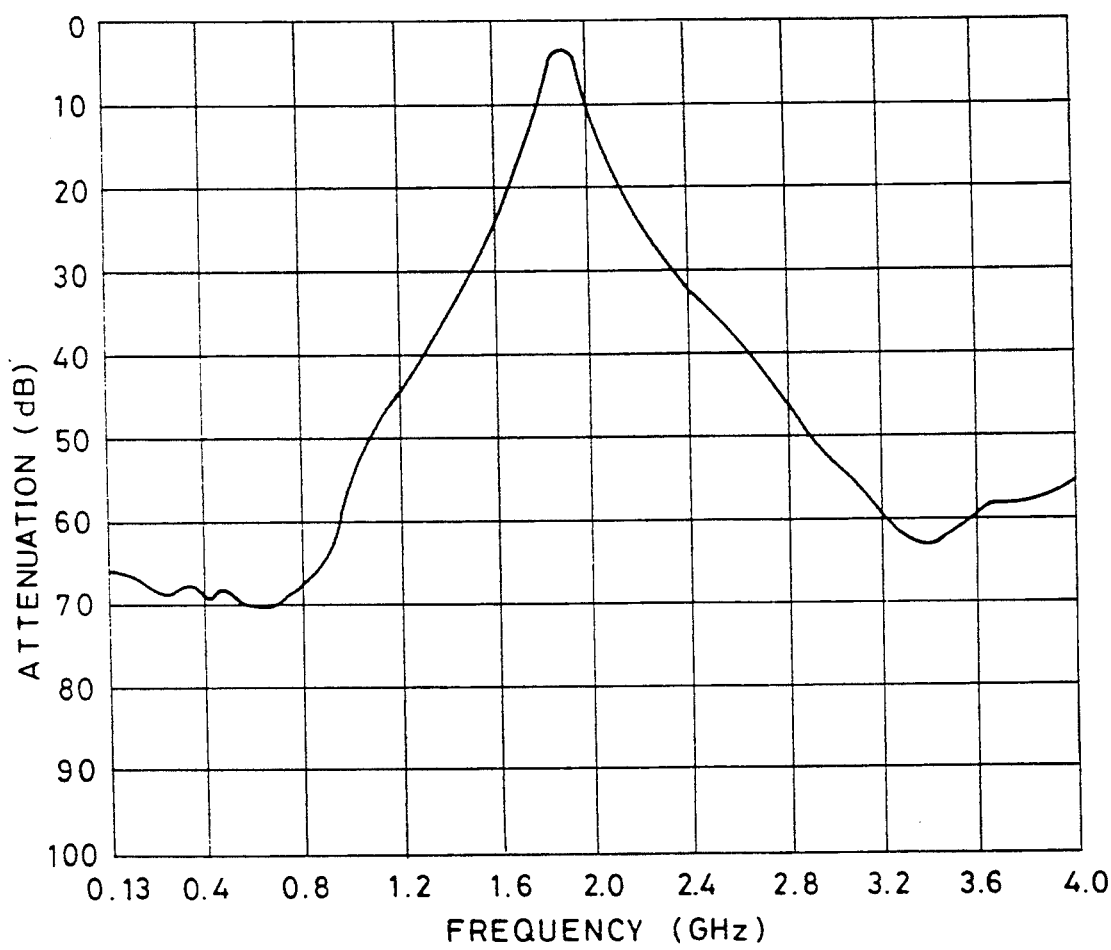
FIG. 12 is a graph showing frequency characteristics of the band pass filter.

A first example of the present invention is described in the following with reference to FIG. 1 through FIG. 12. FIG. 1 is an exploded perspective view of a band-pass filter according to a first example of the present invention, FIG. 2 is a plan view of a dielectric sheet used therein, FIG. 3 is a plan view showing a state where a second earth electrode pattern is formed on the dielectric sheet of FIG. 2, FIG. 4 is a plan view showing a state where a first coil electrode pattern is formed on the dielectric sheet of FIG. 2, FIG. 5 is a plan view showing a state where a first earth electrode pattern is formed on the dielectric sheet of FIG. 2, FIG. 6 is a plan view showing a state where a second coil electrode pattern is formed on the dielectric sheet of FIG. 2, FIG. 7 is a side view when the dielectric sheets are laminated, FIG. 8 is a front view when a laminate is pressed, FIG. 9 is a plan view when external electrodes are formed, FIG. 10 is a front view when external electrodes are formed, FIG. 11 is an equivalent circuit diagram of the band-pass filter, FIG. 12 is a graph showing frequency characteristics of the band pass filter.

As shown in FIG. 1, the band-pass filter of the present invention comprises, a dielectric layer 1 consisting of plural dielectric sheets 101 . . . and protective layers 2, 3 provided on upper and lower sides of the dielectric layer 1. The protective layers 2 and 3 may consist of plural dielectric sheets. On one surface 101a of a middle dielectric sheet 101, a first earth electrode pattern 4 which serves as a first electrode is formed. To the first earth electrode pattern 4, earth terminal patterns 5a and 5b are connected, and end portions of those earth terminal patterns 5a and 5b are extended to the side faces A and B of the band-pass filter. At one side in the first earth electrode pattern 4, a connecting window 8 is formed for magnetically connecting (coupling) a first coil electrode pattern and a second coil electrode pattern which are mentioned in more detail below.

Meanwhile, a first coil electrode pattern 6 and a second coil electrode pattern 7 as second electrodes are formed on surfaces 101b and 101c of the dielectric sheets 101 which are disposed within the dielectric layer 1 on upper and lower sides of the first earth electrode pattern 4. These are fired and with one another.

A specific construction of the first coil electrode pattern 6 may comprise, a pattern piece 6a with a gap 9 formed in part thereof, and a pattern piece 6b. The pattern pieces 6a, 6b are linear and are disposed on opposite sides of the pattern 6 and are connected via linear pattern pieces 6c and 6d which are connected to both ends of the pattern pieces 6a, 6b (that is, forming a loop shape including the gap 9). The first coil electrode pattern 6 is so formed that it has a somewhat smaller shape than the periphery of the first earth electrode pattern 4.

A total length $L_6$ of the first coil electrode pattern 6 becomes the length shown in Equation 3.

$$L_3 = \frac{1}{4} \lambda \times \frac{1}{\sqrt{\epsilon}} \qquad \text{Equation 3}$$

Where, $\lambda$; wavelength, $\epsilon$; dielectric constant.

It is desirable that a distance $L_2$ of the gap 9 is equal to or less than a width $L_3$ of the pattern piece 6a, 6b, 6c or 6d.

The second coil electrode pattern 7 is similar to the first coil electrode pattern 6 in consisting of pattern pieces 7a, 7b, 7c and 7d and having a gap 10, but differs from the first coil electrode pattern 6 that it is oriented in the opposite direction with respect to the dielectric layer 1.

With regard to the coil electrode patterns 6 and 7, the pattern piece 6d of the first coil electrode pattern 6 and the pattern piece 7d of the second coil electrode pattern 7 are connected magnetically to one another via a connecting window 8 formed in the first earth electrode pattern 4.

The first coil electrode pattern 6 is connected to, an earth terminal pattern 11 formed at the portion thereof corresponding to the earth terminal pattern 5a and an input/output terminal pattern 12 formed at a predetermined distance $L_4$ from the earth terminal pattern 11, and the earth terminal pattern 11 and the input/output terminal pattern 12 are extended to a side face A of the band-pass filter. The second coil electrode pattern 7 is connected to, an earth terminal pattern 13 formed at a portion thereof corresponding to the earth terminal pattern 5b and an input/output terminal pattern 14 formed at a predetermined distance $L_6$ from the earth terminal pattern 13, and the earth terminal pattern 13 and the input/output terminal pattern 14 are extended to a side face B of the band-pass filter.

Second earth electrode patterns 15 and 16 which serve as third electrode are formed on a face 3a of the protective layer 3 on one side of the dielectric layer 1 and on a face 101d of the dielectric sheet 101 adjacent to the protective layer 2, and are constituted such that the size of the second earth electrode patterns 15 and 16 is as same as the size of the first earth electrode pattern 4. However, the second earth electrode patterns 15 and 16 differ from the first earth electrode pattern 4 in the absence of the connecting window 8. Also, at positions on the face 3a corresponding to the earth terminal patterns 5a and 5b, earth terminal patterns 17 and 18 each having one end connected to the second earth electrode pattern 15 and the other end extended to the side face A or B of the band-pass filter. Likewise, at positions on the face 101d corresponding to the earth terminal patterns 5a and 5b, earth terminal patterns 19 and 20 each have one end connected to the second earth electrode pattern 16 and the other end extended to the side face A or B of the band-pass filter.

The earth terminal patterns 5a, 11, 17 and 19 are connected to an external earth electrode 23, the earth terminal patterns 5b, 13, 18 and 20 are connected to an external earth electrode 24, the input/output terminal pattern 12 is connected to an external input/output electrode 25, and the input/output terminal pattern 14 is connected to an external input/output electrode 26. The external earth electrodes 23, 24 and the external input/output electrodes 25, 26 have a U-shaped cross section and are formed on the side faces of the band-pass filter.

The band-pass filter having the above-mentioned construction was produced by the following procedures.

First, on one surface of a dielectric sheet 101 (about several tens of $\mu$m thick) shown in FIG. 2, a copper paste or the like is coated to form patterns 30 (the same patterns as the second earth electrode pattern 15 and the terminal patterns 17, 18, or the same patterns as the second earth electrode pattern 16 and the terminal patterns 19,20) as shown in FIG. 3. In parallel thereto, on one surface of a protective sheet 101 having the same configuration as the dielectric sheet 101 (however, its thickness may be different), copper paste or the like is coated to form a pattern 31 (the pattern as the first coil electrode pattern 6 and the earth terminal pattern 11, 12) as shown in FIG. 4, a pattern 32 (the pattern as the first earth electrode pattern 4 and the earth terminal patterns 5a, 5b) as shown in FIG. 5, and a pattern 33 (the pattern as the second coil electrode pattern 7 and the earth terminal patterns 13, 14) as shown in FIG. 6.

Next, as shown in FIG. 7, a protective sheet 3, sheet layers 40–43 and the protective sheet 2 (with the same construction as the protective sheet 3) are laminated so that the patterns 30–33 are disposed with sheet layers 40–43 consisted of the dielectric sheets 101 therebetween, and further, are pressed to produce a laminate 45. Then, as shown in FIG. 8, at locations (the locations which serve as the external earth electrodes 23, 24 and the external input/output electrodes 25, 26) corresponding to exposed portions 5a, 5b, 11–14, 17–20 of the above mentioned paste layers, copper paste or the like is printed or coated to produce paste layers 50–53 as shown in FIG. 9 and FIG. 10. Then, the dielectric sheets are integrated by firing the laminate, thereby the band-pass filter is produced. Here, the laminate may be fired by a process separate from firing the paste layers 50–53.

Now, though no capacitor pattern is formed within the band-pass filter which is produced in the above-mentioned manner, it has an equivalent circuit as shown in FIG. 11 (in the figure, reference character M designates a magnetic connection). This is due to two reasons, as follows.

[1] The coil electrode patterns 6, 7 and the earth electrode patterns 4, 15, 16 are at the same potential (that is, in the earthed state).

[2] Since the dielectric layer 1 is interposed between the coil electrode patterns 6, 7 and the earth electrode patterns 4, 15, 16, a floating capacitance is produced.

Since the capacitor is formed in such a manner and since the pattern piece 6d of the first coil electrode pattern 6 and the pattern piece 7d of the second coil electrode pattern 7 are magnetically connected, the band-pass filter has the equivalent circuit as shown in FIG. 11.

Since the above-mentioned floating capacitance is mainly produced between the coil electrode patterns 6, 7 and the earth electrode patterns 4, 15, 16, by bringing the coil electrode patterns 6, 7 and the earth electrode patterns 4, 15, 16 close to or apart from one another, the capacitance of the capacitor is changeable and it is therefore possible to change the frequency of the passband. Specifically, when the coil electrode patterns 6, 7 and the earth electrode patterns 4, 15, 16 are brought close to one another (reducing the thickness of the dielectric sheets 101), since the capacitance of the capacitor increases, the passband frequency becomes lower. While, when the coil electrode patterns 6, 7 and the earth electrode patterns 4, 15, 16 are brought apart from one another (increasing the thickness of the dielectric sheets 101), since the capacitance of the capacitor decreases, the passband frequency becomes higher.

The floating capacitance can also be changed by changing the dielectric constant of the dielectric layer 1 or the size of the coil electrode patterns 6, 7. For example, when a width $L_3$ of the coil electrode patterns 6, 7 is broadened, the passband frequency can be minimized because the floating capacitance becomes larger and the passband frequency can be lowered. However, when distances between the pattern pieces are too narrow, the waveform is deteriorated, so that it is not desirable to unnecessarily broaden the width $L_3$ of the coil electrode patterns 6, 7.

Furthermore, a band width of the above-mentioned band-pass filter can be changed by changing a length $L_8$ of the connecting window 8. Specifically, when the length $L_8$ of the connecting window 8 is made longer, the band width becomes wider because the magnetic flux coupling the coil electrode patterns 6 and 7 becomes strong, while when the length $L_8$ of the connecting window 8 is made shorter, the band width becomes narrower because the connecting force between the coil electrode patterns 6 and 7 becomes weak.

Input/output impedances are changed by changing a distance $L_4$ between the earth terminal pattern 11 and the input/output terminal pattern 12, or a distance $L_6$ between the earth terminal pattern 13 and the input/output terminal pattern 14.

According to an experiment, by adjusting a dielectric constant or thickness of the dielectric layer 1 or an area of the coil electrode patterns 6 and 7, applicable frequencies of the band-pass filter of the present invention could be adjusted over a range of several hundred MHz to several GHz. An example thereof is shown in the following experiment.

Experiment

Frequency characteristics of the band-pass filter having the above-mentioned construction were examined, and the result is shown in FIG. 12.

Other respect

[1] In the case of installing the band-pass filter of the present invention, it may be installed and soldered while electrodes on a printed circuit board and the external earth electrodes 23, 24 and the external take-out electrodes 25, 26 are positioned against one another. At this time, since the outsides are covered with the protective layers 2, 3, the coil electrode patterns 6, 7 and the earth electrode patterns 4, 15, 16 are protected from damage.

[2] The dielectric layer 1 is not limited to the construction where several thin dielectric sheets 101 are laminated, but in addition a dielectric sheet which is formed into a predetermined thickness beforehand may be used.

[3] The band-pass filter of the present invention need not be produced one by one, but also may be produced by forming plural coil electrode patterns 6, 7 on a broad dielectric sheet, and the same number of earth electrode patterns 4, 15, 16 on a similar dielectric sheet, and then laminating the sheets, and then cutting apart individual band-pass filters one by one for firing.

[4] The construction of the coil electrode patterns 6 and 7 is not limited to those shown in the above-mentioned various examples. For example, the coil electrode patterns may have loop shapes as shown in FIG. 13, FIG. 14 and FIG. 15.

Second Example

Figure 16:
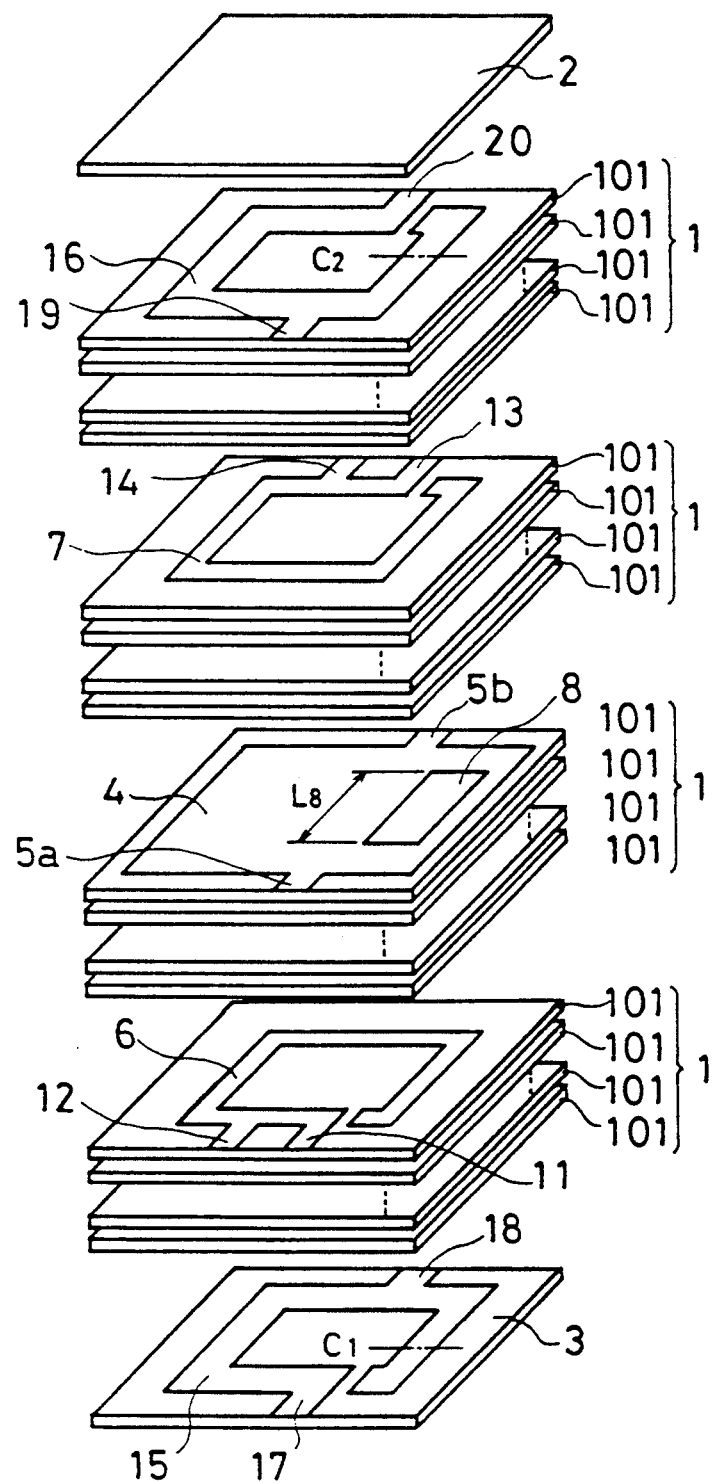
FIG. 16 is an exploded perspective view of a band-pass filter according to a second example of the present invention.

A second example of the present invention is described in the following with reference to FIG. 16. FIG. 16 is an exploded perspective view showing a band-pass filter according to a second example of the present invention.

As shown in FIG. 16, it has the same configuration as the band-pass filter of the first example, except that the shape of the second earth electrode patterns is different. Specifically, the shape of each of the second earth electrode patterns 15 and 16 is similar to that of the respective coil electrode pattern on the same side of the first earth electrode pattern, but the pattern pieces of the second earth electrode patterns 15 and 16 are somewhat broader than the coil electrode patterns 6 and 7.

With such a configuration, it is possible to simply adjust the frequency, because the floating capacitance can be adjusted just by cutting a portion (e.g. the portion shown by two-dot chain line $C_1$, $C_2$ in FIG. 16) of the second earth electrode patterns 15, 16 corresponding to the coil electrode patterns 6 and 7.

Though the above-mentioned type of adjustment is also possible for the earth electrode patterns of the first example (formed across the entire area or the band-pass filter almost), when the frequency is to be adjusted, the configuration of this second example is preferable, because the required cut length of the earth electrode patterns of the first example is long.

Third Example

Figure 17:
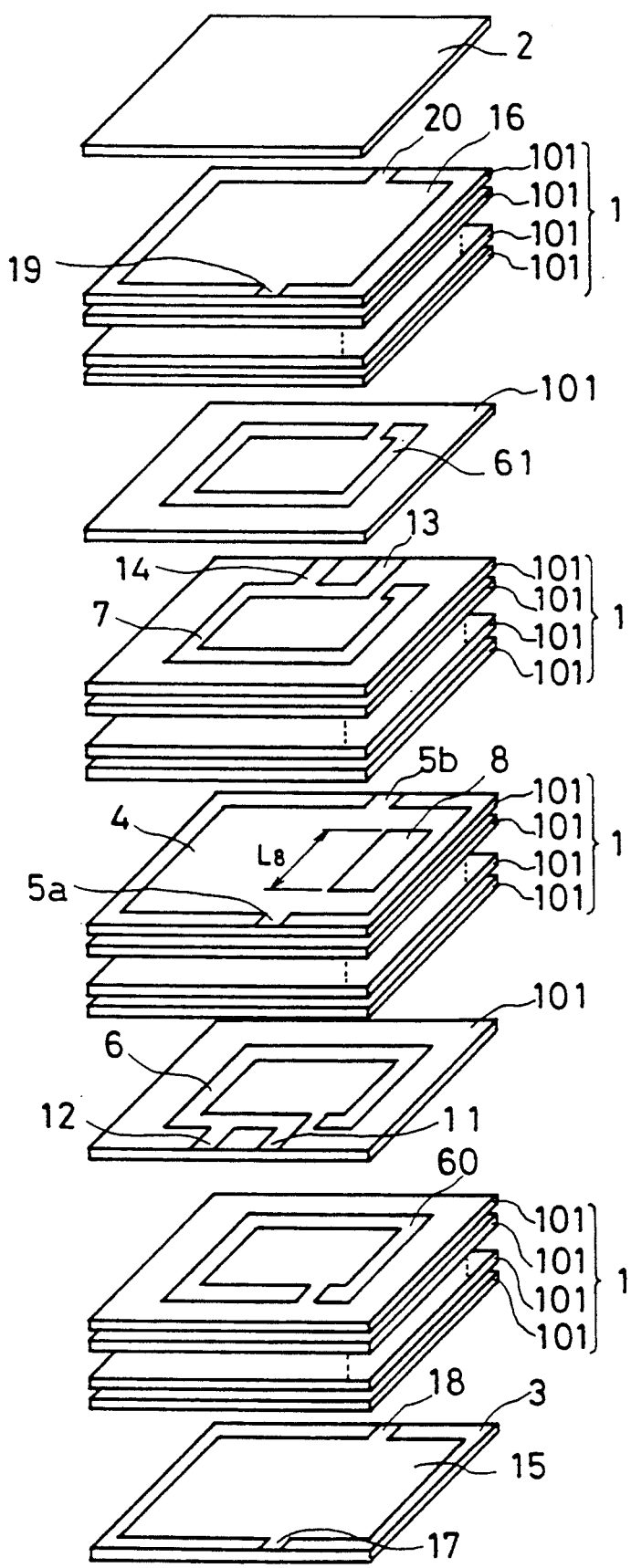
FIG. 17 is an exploded perspective view showing a third example of the band-pass filter of the present invention.
Figure 18:
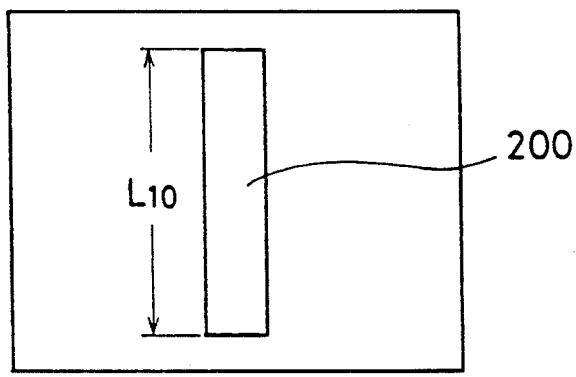
FIG. 18 is an explanatory view showing an example of a conventional strip-line type dielectric resonator.
Figure 19:
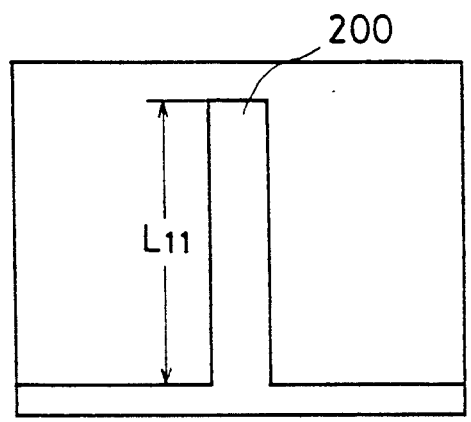
FIG. 19 is an explanatory view showing another example of a conventional strip-line type dielectric resonator.
Figure 20:
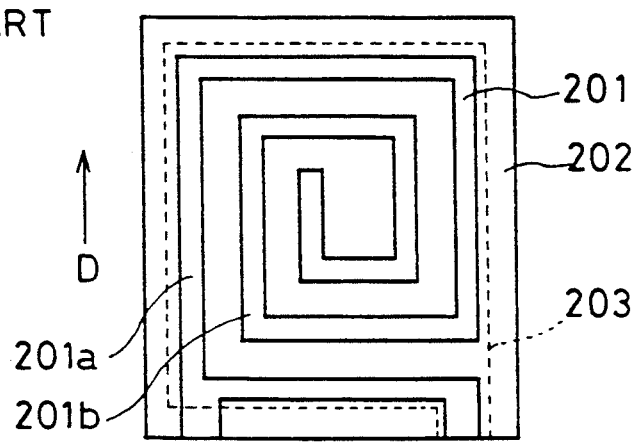
FIG. 20 is an explanatory view showing an example of a conventional coil-pattern type dielectric resonator.

A third example of the present invention is described in the following with reference to FIG. 17. FIG. 17 is an exploded perspective view of a band-pass filter according to the third example of the present invention.

As shown in FIG. 17, it has the same configuration as the band-pass filter of the first example, except floating electrode patterns 60, 61 having a same shape as the coil electrode patterns 6, 7 are formed on the dielectric sheets 101, 101 adjacent to the dielectric sheets 101, 101 whereon the coil electrode patterns 6, 7 are formed.

Although not shown, it has been confirmed by experiment that with such a configuration a peak of the pass-band frequency becomes much lower than with the band-pass filter of the first example.

This is believed to be due to an increase in capacitance of the capacitor of the band-pass filter, because a floating capacitance is formed between the coil electrode patterns 6, 7 and the floating electrode patterns 60, 61.

It will be apparent from the foregoing that, while the present invention has been described in detail and illustrated, these are only particular illustrations and example and the invention is not limited to those. The spirit and scope of the invention is limited only by the appended claims.

What is claimed is:

1. A band-pass filter comprising:
   a first earth electrode;
   first and second coil electrodes each formed in a loop shape and disposed on opposite sides of said first earth electrode, a pair of plates containing a dielectric material disposed respectively between said first earth electrode and said first and second coil electrodes;
   two earth terminals drawn out respectively from said first and second coil electrodes toward a periphery of said plates;
   two input/output terminals drawn out respectively from said first and second coil electrodes toward said periphery of said plates at a predetermined distance from said earth terminals along said first and second coil electrodes, so as to provide a predetermined input/output impedance; and
   a pair of additional earth terminals drawn out from said first earth electrode toward said periphery of said plates, wherein a connecting window located and arranged for providing magnetic coupling between said first and second coil electrodes is formed in said first earth electrode.

2. A band-pass filter according to claim 1, wherein a pair of second earth electrodes are formed on respective sides of said band-pass filter and associated with respective ones of said first and second coil electrodes, a pair of plates containing a dielectric material disposed respectively between said first and second coil electrodes and said second earth electrodes, and earth terminals are extended from said second earth electrodes to the periphery of said plates.

3. A band-pass filter according to claim 2, wherein said second earth electrodes are formed over substantially the same surface area as said first earth electrode.

4. A band-pass filter according to claim 2, wherein said second earth electrodes are formed with a similar shape to that of said respective first and second coil electrodes but somewhat larger.

5. A band-pass filter according to claim 2, wherein between said first and second coil electrodes and said second earth electrodes, respective floating electrodes having a shape similar to that of said first and second coil electrodes are formed.

6. A band-pass filter according to claim 3, wherein between said first and second coil electrodes and said second earth electrodes, respective floating electrodes having a shape similar to that of said first and second coil electrodes are formed.

7. A band-pass filter according to claim 4, wherein between said first and second coil electrodes and said second earth electrodes, respective floating electrodes having a shape similar to that of said first and second coil electrodes are formed.

8. A band-pass filter according to claim 2, wherein between at least one of said first and second coil electrodes and the corresponding second earth electrode, a floating electrode having a shape similar to that of said corresponding coil electrode is formed.

9. A band-pass filter according to claim 3, wherein between at least one of said first and second coil electrodes and the corresponding second earth electrode, a floating electrode having a shape similar to that of said corresponding coil electrode is formed.

10. A band-pass filter according to claim 4, wherein between at least one of said first and second coil electrodes and the corresponding second earth electrode, a floating electrode having a shape similar to that of said corresponding coil electrode is formed.

11. A band-pass filter according to claim 1, wherein said band-pass filter has a plurality of sides including at least one terminal side, and one of said additional earth terminal and said input/output terminal associated with one of said coil electrodes are drawn out to said terminal side.

12. A band-pass filter according to claim 11, wherein said respective terminals associated with each of said first and second coil electrodes are drawn out to different sides of said band-pass filter.

13. A band-pass filter according to claim 1, wherein said input/output terminals and said earth terminals are directly conductively connected to external electrodes on said periphery of said plate.

14. A band-pass filter according to claim 13, wherein said earth terminals from said first and second coil electrodes are directly conductively connected respectively to said pair of additional earth terminals.

15. A band-pass filter according to claim 1, wherein said earth terminals from said first and second coil electrodes are directly conductively connected respectively to said pair of additional earth terminals.

16. A band-pass filter according to claim 1, wherein each said coil electrode forms a closed loop shape.

17. A band-pass filter according to claim 1, wherein each said coil electrode forms a loop shape which includes a gap.

18. A band-pass filter comprising:
first and second coil electrodes each formed in a loop shape and disposed in a magnetically coupled state with respect to each other;
a first earth electrode formed in a plane shape between said first and second coil electrodes, and having a window formed therein for providing magnetic coupling between said first and second coil electrodes;
a pair of plates comprising a dielectric material, said plates having a periphery and being respectively disposed between said first earth electrodes and said first and second coil electrodes;
two earth terminals drawn out respectively from said first and second coil electrodes toward said periphery of said plate;
two input/output terminals associated respectively with said two earth terminals and drawn out from said first and second coil electrodes toward said periphery of said plate;
said earth terminals and input/output terminals being spaced apart by a selected distance along said coil electrodes so as to provide respective predetermined input/output impedances.

19. A band-pass filter according to claim 18, further comprising a pair of second earth terminals drawn out from said earth electrode toward said periphery of said plate.

20. A band-pass filter according to claim 18, wherein said band-pass filter has a plurality of sides including at least one terminal side, and said first earth terminal and said input/output terminal associated with one of said coil electrodes are both drawn out to said terminal side.

21. A band-pass filter according to claim 20, wherein said respective terminals associated with each of said first and second coil electrodes are drawn out to different sides of said band-pass filter.

22. A band-pass filter comprising:
first and second coil electrodes formed in a loop shape and disposed in a magnetically coupled state with respect to each other;
a first earth electrode formed in a plane shape between said first and second coil electrodes, and having a window formed therein for providing magnetic coupling between said first and second coil electrodes;
a pair of second earth electrodes each formed in a plane shape opposite said first and second coil electrodes on opposite sides thereof;
a plurality of plates comprising a dielectric material, each said plate having a periphery and being disposed between said first and second coil electrodes and a respective one of said first and second earth electrodes;
a pair of first earth terminals drawn out respectively from said first and second coil electrodes toward said periphery of said plate;
a pair of input/output terminals associated respectively with said first earth terminals and drawn out respectively from said first and second coil electrodes toward said periphery of said plate;
said first earth terminals and input/output terminals being spaced apart along said coil electrodes by a selected distance so as to provide respective predetermined input/output impedances.

23. A band-pass filter according to claim 22, further comprising a pair of second earth terminals drawn out from said first and second earth electrodes toward said periphery of said plate.

24. A band-pass filter according to claim 22, wherein said band-pass filter has a plurality of sides including at least one terminal side, and said first earth terminal and said input/output terminal associated with one of said coil electrodes are both drawn out to said terminal side.

25. A band-pass filter according to claim 24, wherein said respective terminals associated with each of said first and second coil electrodes are drawn out to different sides of said band-pass filter.

26. A band-pass filter according to claim 1, wherein said two earth terminals drawn out respectively from said first and second coil electrodes, and respective ones of said pair of additional earth terminals drawn out from said first earth electrode, are connected together at said periphery.

27. A band-pass filter according to claim 2, wherein said earth terminals extended from said second earth electrodes, and respective ones of said pair of said pair of additional earth terminals drawn out from said first earth electrode, are connected together at said periphery.

28. A band-pass filter according to claim 1, wherein said band-pass filter has a plurality of sides, and said earth terminals and input/output terminals are drawn out from each of said coil electrodes to a single one of said sides of the band-pass filter so as to be simultaneously accessible at said side of said band-pass filter.

* * * * *